(12) United States Patent
Huang et al.

(10) Patent No.: US 11,036,076 B2
(45) Date of Patent: Jun. 15, 2021

(54) DISPLAY DEVICE HAVING EYE PROTECTION

(71) Applicant: HON HAI PRECISION INDUSTRY CO., LTD., New Taipei (TW)

(72) Inventors: Li-Chiao Huang, New Taipei (TW); Chien-Ming Huang, New Taipei (TW); Kuan-Wei Chou, New Taipei (TW); Yu-Wen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/672,828

(22) Filed: Nov. 4, 2019

(65) Prior Publication Data
US 2020/0278578 A1 Sep. 3, 2020

(30) Foreign Application Priority Data
Mar. 1, 2019 (CN) .......................... 201910155060.3

(51) Int. Cl.
| | | |
|---|---|---|
| *G02F 1/1335* | (2006.01) |
| *H01L 33/50* | (2010.01) |
| *G02F 1/13357* | (2006.01) |
| *F21V 8/00* | (2006.01) |

(52) U.S. Cl.
CPC .. *G02F 1/133514* (2013.01); *G02F 1/133528* (2013.01); *G02F 1/133603* (2013.01); *H01L 33/502* (2013.01); *H01L 33/507* (2013.01); *G02B 6/0051* (2013.01); *G02B 6/0053* (2013.01); *G02B 6/0055* (2013.01); *G02F 1/133562* (2021.01); *G02F 1/133567* (2021.01); *G02F 1/133614* (2021.01)

(58) Field of Classification Search
None
See application file for complete search history.

(56) References Cited

U.S. PATENT DOCUMENTS

| | | | | |
|---|---|---|---|---|
| 6,051,148 A | * | 4/2000 | Perry | ................... C23F 1/36 216/102 |
| 9,316,779 B1 | * | 4/2016 | Hou | ................... G02B 6/0068 |
| 2002/0080501 A1 | * | 6/2002 | Kawae | ............ C09K 11/7774 359/799 |

(Continued)

FOREIGN PATENT DOCUMENTS

| | | |
|---|---|---|
| CN | 106019444 A | 10/2016 |
| TW | 201510580 A | 3/2015 |
| TW | 201541154 A | 11/2015 |

*Primary Examiner* — James A Dudek
(74) *Attorney, Agent, or Firm* — ScienBiziP. P.C.

(57) ABSTRACT

A display device which is not harmful to the human eye in respect of blue light includes a display panel, a backlight module, and a light adjusting component. The backlight module includes white light emitting diodes (LEDs) for emitting light. Each white LED includes a blue light chip and a yellow fluorescent material encapsulated on the blue light chip. Thereby, transmittance of the light adjusting component for blue light having a wavelength less than 450 nm is less than 10% and transmittance of light adjusting component for blue light having a wavelength over 470 nm is not less than 90%. The light adjusting component reduces the emission from the display device of yellow light having a wavelength of about 575 nm to 595 nm.

16 Claims, 9 Drawing Sheets

(56) References Cited

U.S. PATENT DOCUMENTS

| | | | |
|---|---|---|---|
| 2012/0070963 A1* | 3/2012 | Martin | C30B 25/165 |
| | | | 438/478 |
| 2012/0314411 A1* | 12/2012 | Nagasaki | G03B 21/204 |
| | | | 362/231 |
| 2015/0309368 A1* | 10/2015 | Su | G02B 5/24 |
| | | | 349/61 |
| 2020/0089046 A1* | 3/2020 | Li | G02F 1/133603 |
| 2020/0217993 A1* | 7/2020 | Fukagawa | G02B 1/14 |
| 2020/0227600 A1* | 7/2020 | Watanabe | H01L 33/54 |

* cited by examiner

DISPLAY DEVICE HAVING EYE PROTECTION

FIELD

The subject matter herein generally relates to display devices.

BACKGROUND

A heavily-colored image can be achieved by adjusting a ratio of red light, green light, and blue light. However, blue light can easily pass through the lens of the human cornea and contacts the retina, accelerates oxidation of cells in the retinal spot area, causes lesions in the spot area of the human retina, damages the visual cells, and thus adversely affects the eye.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

A wavelength of blue light is usually between 400 nm and 500 nm. It has been found that blue light having a wavelength between 415 nm and 455 nm is damaging to the eyes. Therefore, blue light of the above-described wavelength should be prevented from adversely affecting eyes by reducing the blue light of the wavelength between 415 nm and 455 nm emitting from the display device.

Figure 1:
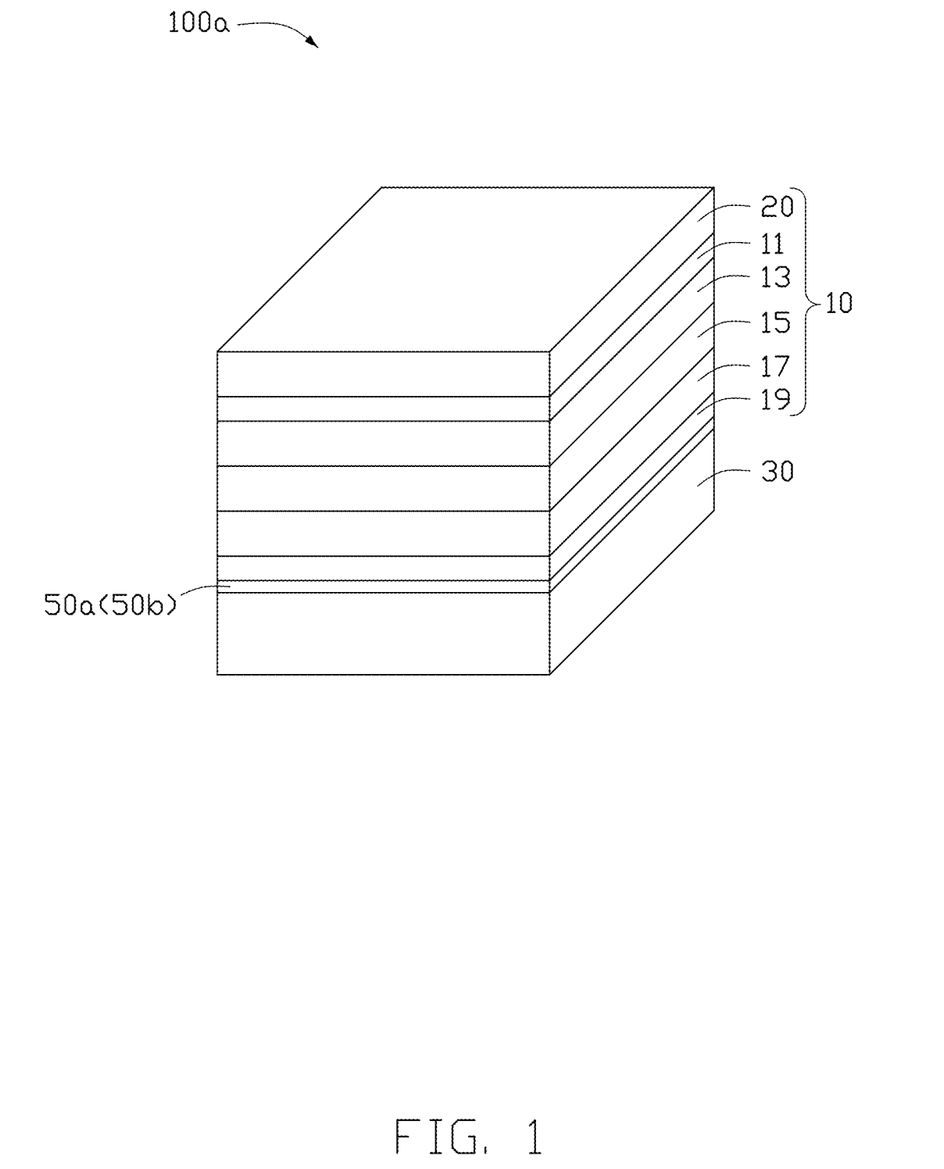
FIG. 1 is an isometric view of a display device according to a first embodiment of the present disclosure.

As shown in FIG. 1, a display device 100a according to a first embodiment includes a backlight module 30 and a display panel 10 stacked on the backlight module 30. The display panel 10 is a liquid crystal display panel and the output of light is controlled by rotating liquid crystal molecules. The backlight module 30 is configured to provide light to the display panel 10.

The display panel 10 includes a transparent cover 20, an upper polarizer 11, a color filter substrate 13, a liquid crystal layer 15, a thin film transistor (TFT) substrate 17, and a lower polarizer 19, which are sequentially stacked in that order, wherein the lower polarizer 19 is adjacent to the backlight module 30. The color filter substrate 13 is opposite to the TFT substrate 17. The liquid crystal layer 15 is between the color filter substrate 13 and the TFT substrate 17. The upper polarizer 11 allows light having a polarization direction in a first direction to pass through, and the lower polarizer 19 allows light having a polarization direction in a second direction, perpendicular to the first direction, to pass through.

Light emitting from the backlight module 30 sequentially passes through the lower polarizer 19, the TFT substrate 17, the liquid crystal layer 15, the color filter substrate 13, the upper polarizer 11, and the transparent cover 20. Rotation of the liquid crystal molecules in the liquid crystal layer 15 causes the polarization direction of the light to change, thus images display is realized.

Figure 6:
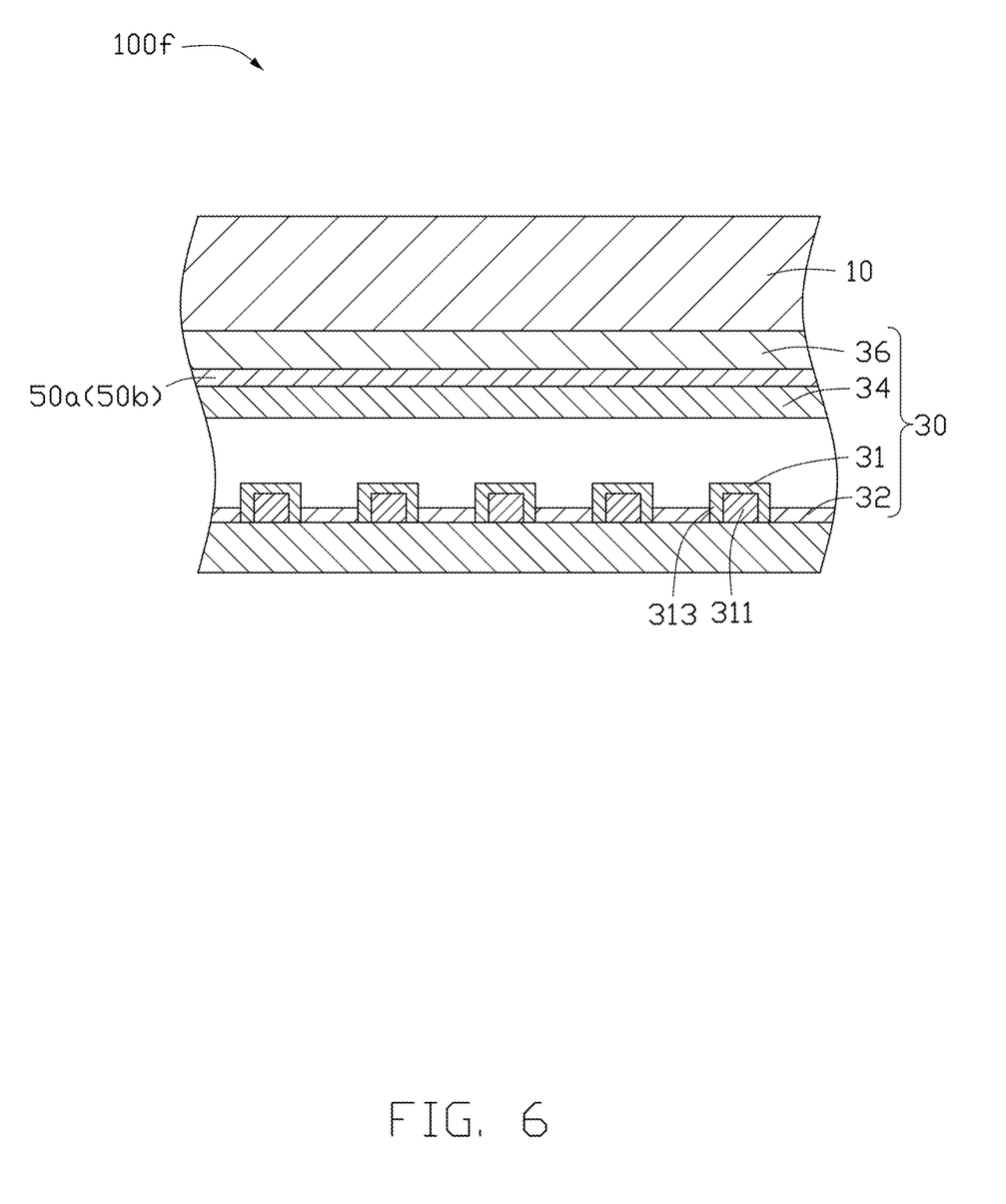
FIG. 6 is an isometric view of a display device according to a sixth embodiment of the present disclosure.
Figure 7:
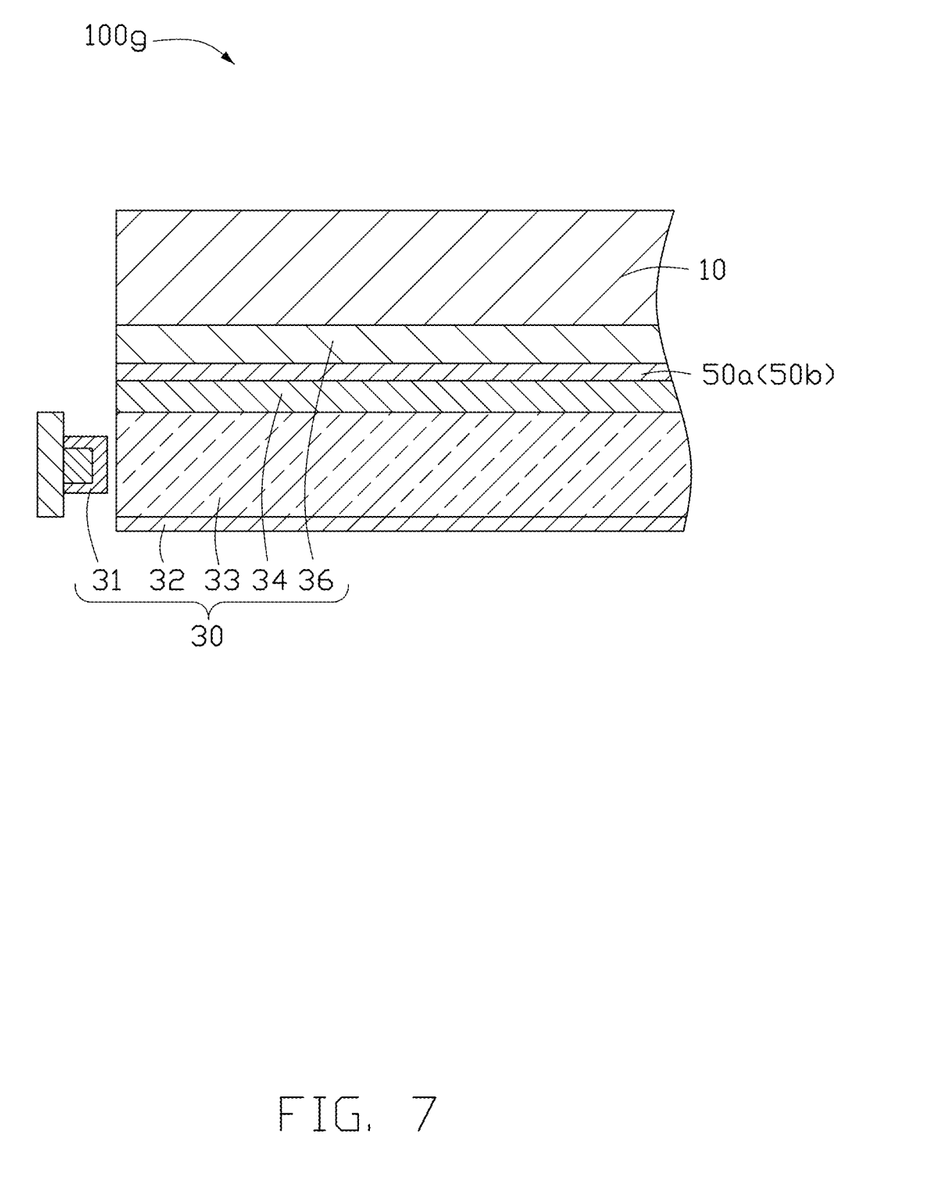
FIG. 7 is an isometric view of a display device according to a seventh embodiment of the present disclosure.
Figure 8:
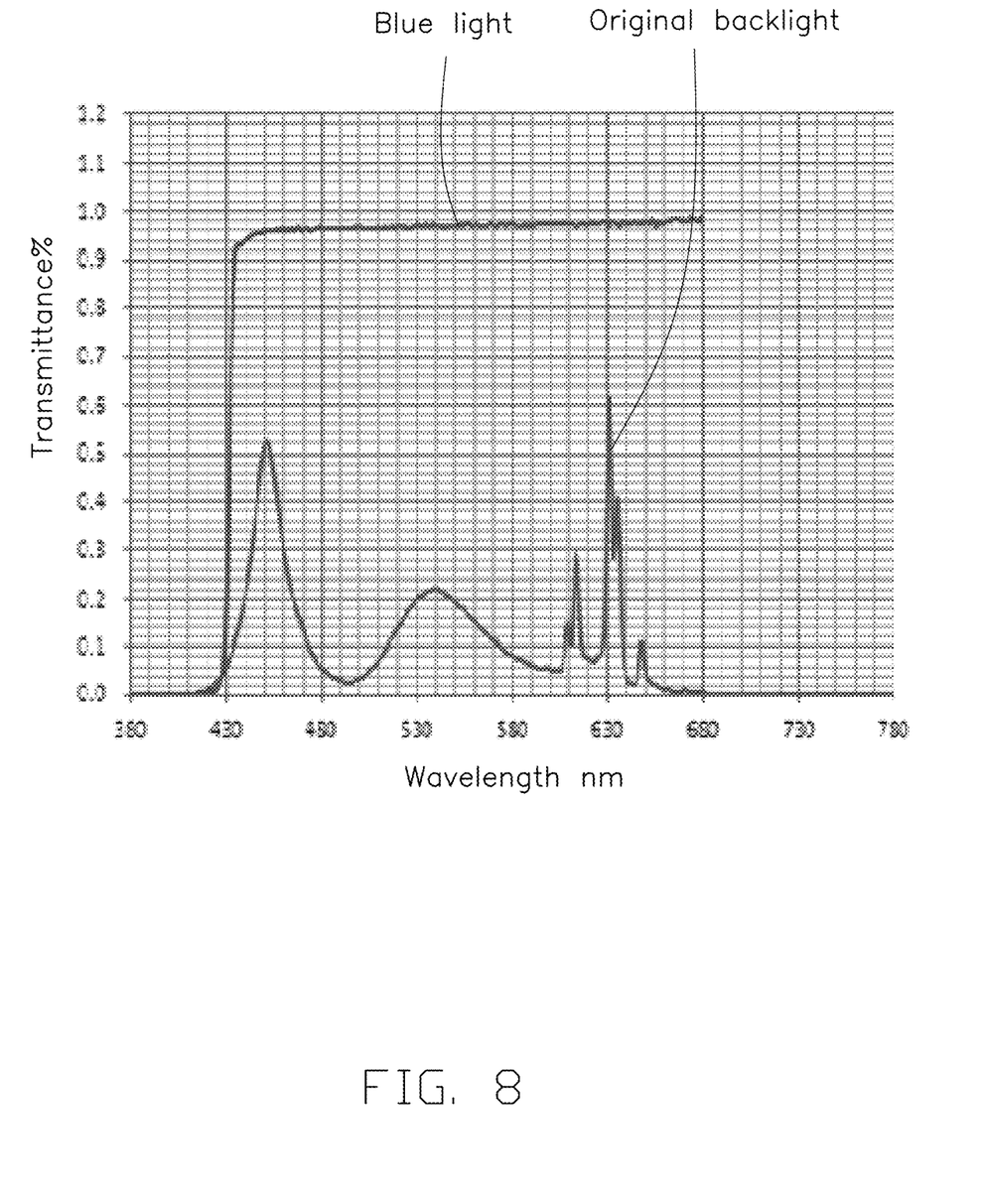
FIG. 8 is a graph showing a light transmittance of the light adjusting component of a first embodiment.

The backlight module 30 includes a plurality of white light emitting diodes (LEDs) 31 for emitting light. White LEDs 31 are not shown in FIG. 1 but are shown in FIG. 6 and FIG. 7. Each white LED 31 includes a blue light chip 311 and a fluorescent material 313 encapsulated on the blue light chip 311. In one embodiment, the fluorescent material 313 includes a red fluorescent material and a green fluorescent material. The blue light emitted by the blue light chip 311 has a peak wavelength in a spectrum in a range from 460 nm to 475 nm. As shown in FIG. 1, a light adjusting component 50a is provided in the display device 100a, and the light adjusting component 50a reduces the blue light having a wavelength between 415 nm and 455 nm emitted from the display device 100a, thereby reducing harm to eyes and protecting the viewer's vision. Furthermore, no yellow light is emitted from the white LED 31, the color saturation and brightness of the display device 100a can be ensured. In the present embodiment, a transmittance of the light adjusting component 50a for blue light having a wavelength less than 450 nm is less than 10%, a transmittance of light adjusting component 50a for blue light having a wavelength over 470 nm is not less than 90%, and a transmittance of the light adjusting component 50a for blue light having a wavelength in a range from 450 nm to 470 nm increases with an increase in the wavelength of the blue light, as shown in FIG. 8.

Figure 9:
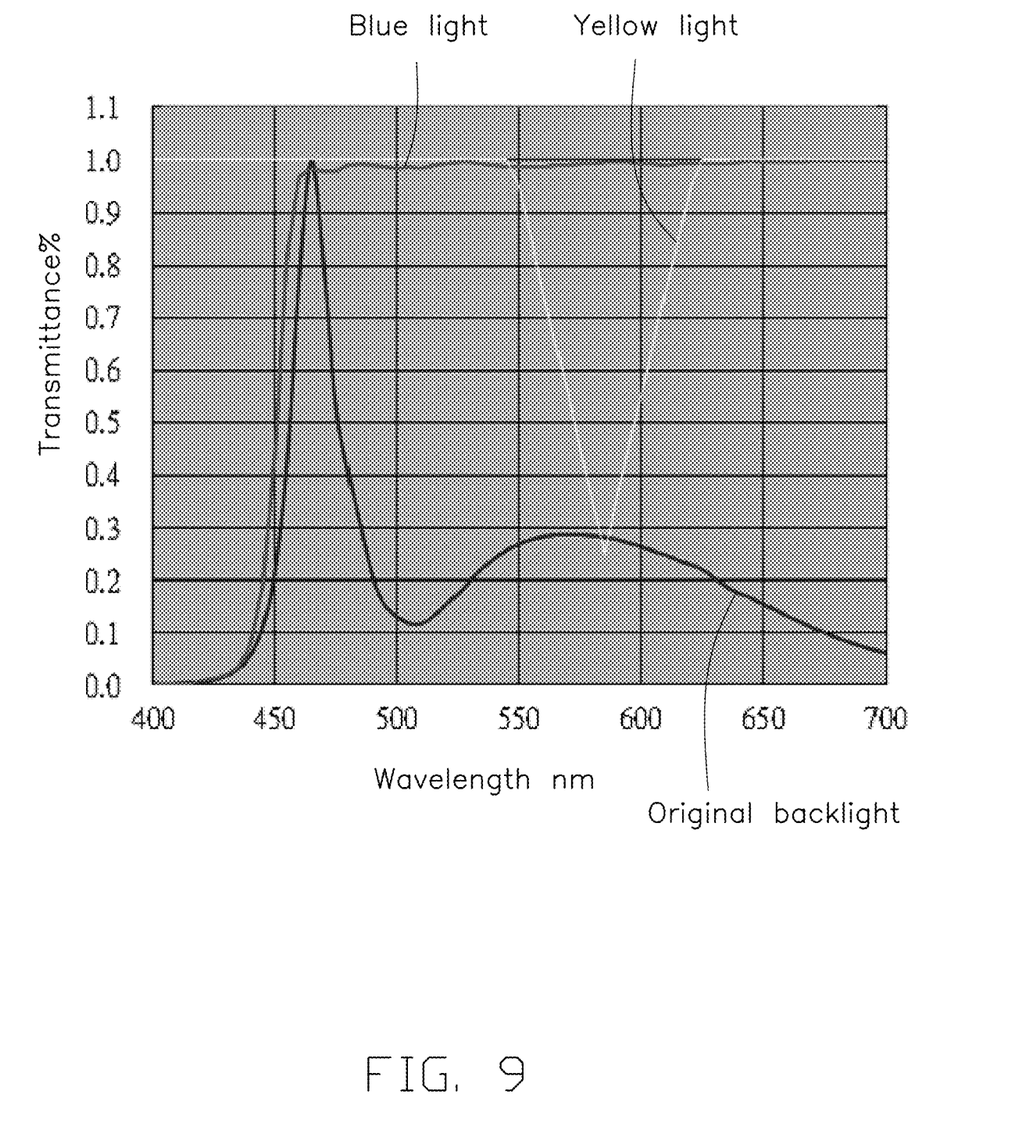
FIG. 9 is a graph showing the light transmittance of the light adjusting component of a second embodiment.

In another embodiment, the fluorescent material 313 is yellow fluorescent material. The blue light emitted by the blue light chip 311 has a peak wavelength in a range from 460 nm to 475 nm. The yellow fluorescent material may be aluminate fluorescent material or silicate fluorescent material. At this time, the light emitted from the white LED 31 contains yellow light. Yellow light having a wavelength of about 575 nm to 595 nm has an adverse effect on a color saturation of the display images. Therefore, it is necessary to reduce yellow light having a wavelength of about 575 nm to 595 nm emitted from the display device, thereby improving the color saturation of the display device 100a. In this case, as shown in FIG. 1, a light adjusting component 50b is positioned in the display device 100a, and the light adjusting component 50b can reduce both blue light having a wavelength in a range from 415 nm to 455 nm and yellow light having a wavelength in a range from 575 nm to 595 nm. In the present embodiment, as shown in FIG. 9, a transmittance of the light adjusting component 50b for blue light having a wavelength less than 450 nm is less than 10%, a transmittance of the light adjusting component 50b for blue light having a wavelength over 470 nm is not less than 90%, and a transmittance of the light adjusting component 50b for blue light having a wavelength in a range from 450 nm to 470 nm increases with an increase of the wavelength of the blue light. By using the light adjusting component 50b, a transmittance curve for the yellow light exhibits a concave peak, a center of the concave peak is between 575 nm and 595 nm, and a width (wavelength range) of the concave peak is 15-30 nm, wherein a transmittance for the yellow light in a center of the concave peak reaches a minimum of approximately 25%.

The light adjusting component 50a or the light adjusting component 50b may be positioned on any layer of the display panel 10 or on the backlight module 30.

The light adjusting component 50a can filter blue light and may have a multilayer structure including an alternating arrangement of two different films, and the two films have different refractive indices. Each of the two films may be made of a material selected from gallium nitride, titanium oxide, aluminum oxide, and indium-tin oxide, silicon oxide, and silicon nitride.

The light adjusting component 50b is capable of filtering blue light and yellow light, and may include a blue light filter film and a yellow light filter film which are stacked together. The blue light filter film may include alternating arrangement of two films, and the two films have different refractive indices. Each of the two films may be made of a material selected from gallium nitride, titanium oxide, aluminum oxide, and indium-tin oxide, silicon oxide, and silicon nitride. The yellow light filter film may include alternating arrangement of two films, and the two films have different refractive indices. Each of the two films may be made of a material selected from gallium nitride, titanium oxide, aluminum oxide, and indium-tin oxide, silicon oxide, and silicon nitride. In other embodiments, the light adjusting component 50b may be a composite film capable of filtering both blue and yellow light.

As shown in FIG. 1, in the first embodiment, the light adjusting component 50 or 50b is positioned between the lower polarizer 19 and the backlight module 30. The light adjusting component 50a or 50b is formed on a surface of the lower polarizer 19 adjacent to the backlight module 30 or a surface of the backlight module 30 adjacent to the lower polarizer 19 by coating or depositing. Alternately, adjusting material is doped into a transparent base material to form a base layer, and the base layer is directly positioned between the lower polarizer 19 and the backlight module 30.

Figure 2:
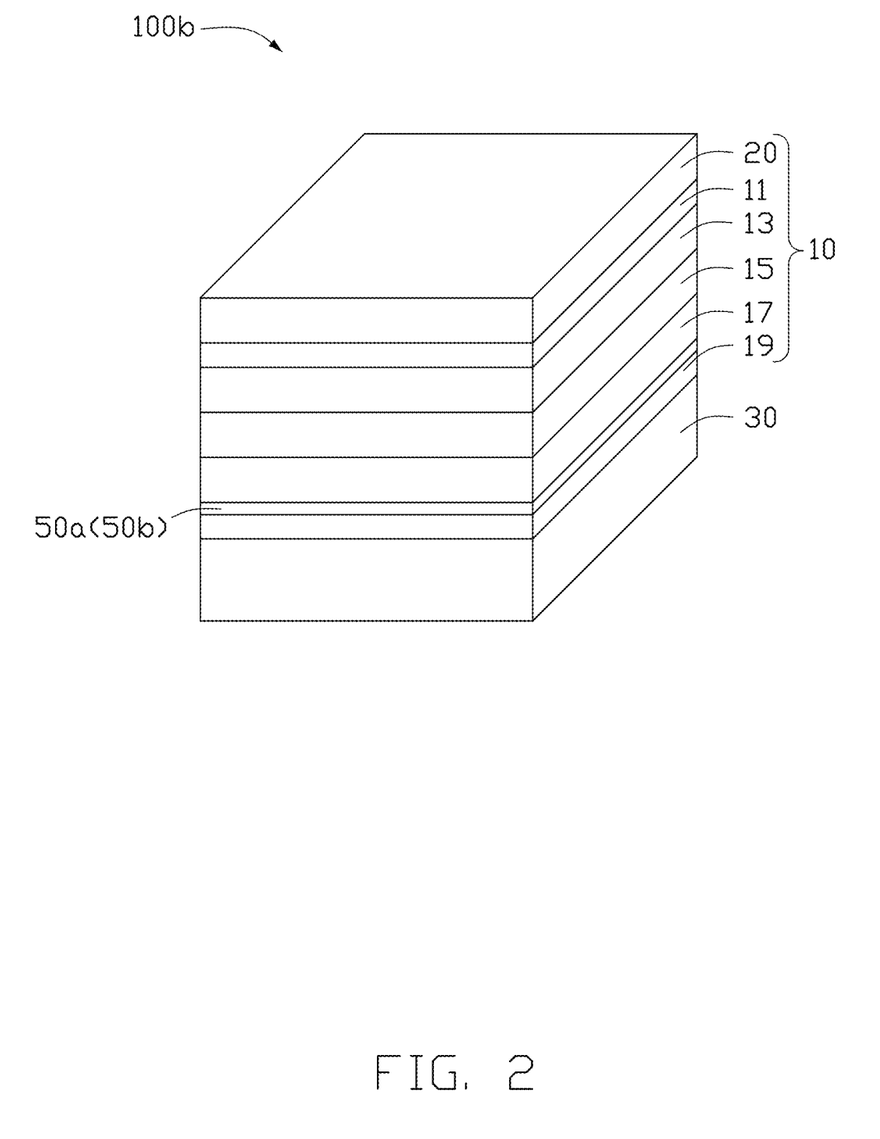
FIG. 2 is an isometric view of a display device according to a second embodiment of the present disclosure.

FIG. 2 illustrates a display device 100b according to a second embodiment of the present disclosure. The display device 100b is substantially the same as the display device 100a of the first embodiment, the display device 100b includes a transparent cover 20, a upper polarizer 11, a color filter substrate 13, a liquid crystal layer 15, a TFT substrate 17, a lower polarizer 19, and a backlight module 30 that are the same as those in the display device 100a. The main difference between the display device 100b and the display device 100a is that, in the second embodiment, the light adjusting component 50a or 50b is positioned between the lower polarizer 19 and the TFT substrate 17. The light adjusting component 50a or 50b is formed on a surface of the lower polarizer 19 adjacent to the TFT substrate 17 or a surface of the TFT substrate 17 adjacent to the lower polarizer 19 by coating or depositing. Alternately, adjusting material is doped into a transparent base material to form a base layer, and the base layer is directly positioned between the lower polarizer 19 and the TFT substrate 17.

Figure 3:
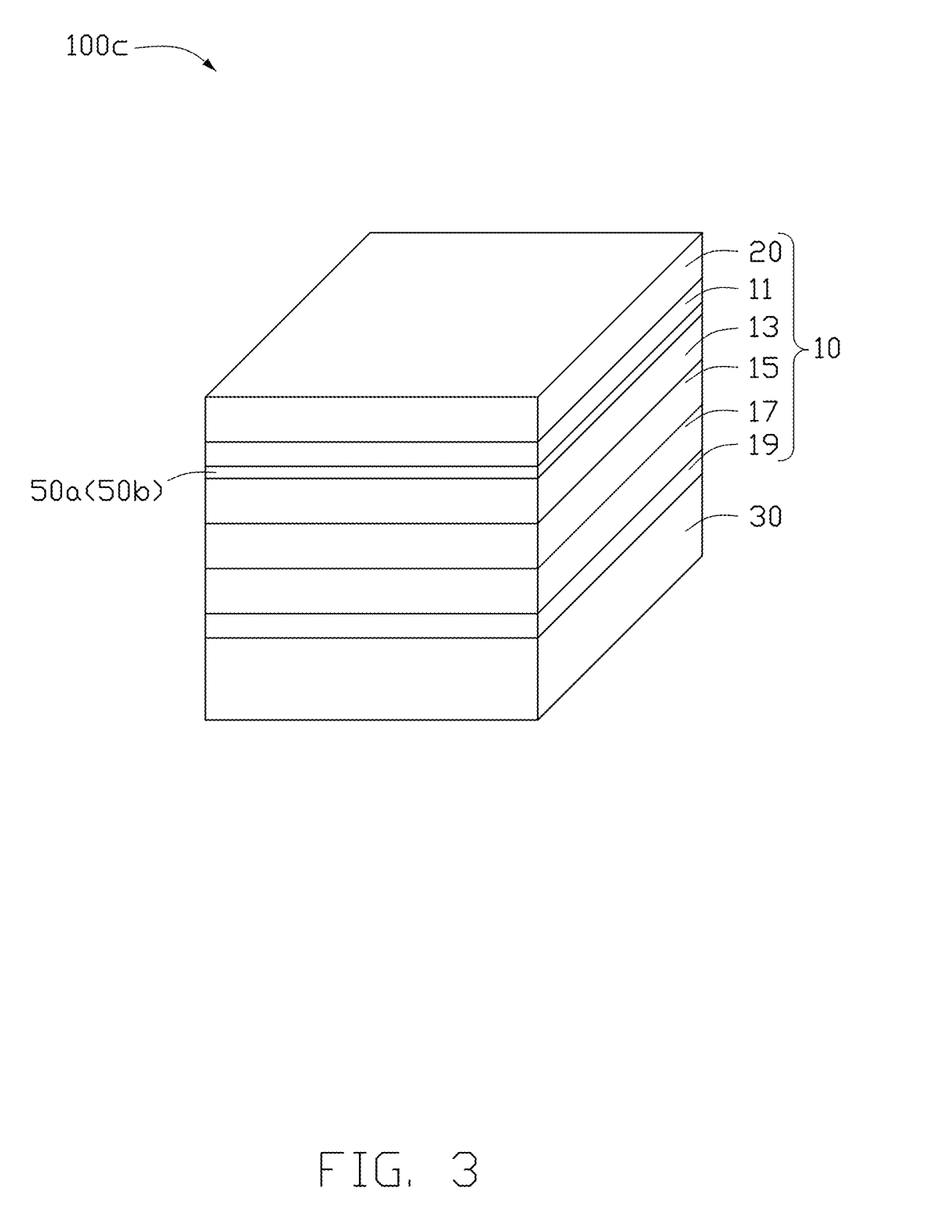
FIG. 3 is an isometric view of a display device according to a third embodiment of the present disclosure.

FIG. 3 illustrates a display device 100c according to a third embodiment of the present disclosure. The display device 100c is substantially the same as the display device 100a of the first embodiment, the display device 100c includes a transparent cover 20, an upper polarizer 11, a color filter substrate 13, a liquid crystal layer 15, a TFT substrate 17, a lower polarizer 19, and a backlight module 30 that are the same as those in the display device 100a. The main difference between the display device 100c and the display device 100a is that, in the third embodiment, the light adjusting component 50a or 50b is positioned between the upper polarizer 11 and the color filter substrate 13. The light adjusting component 50a or 50b is formed on a surface of the color filter substrate 13 adjacent to the upper polarizer 11 or a surface of the upper polarizer 11 adjacent to the color filter substrate 13 by coating or depositing. Alternately, adjusting material is doped into a transparent base material to form a base layer, and the base layer is directly positioned between the upper polarizer 11 and the color filter substrate 13.

Figure 4:
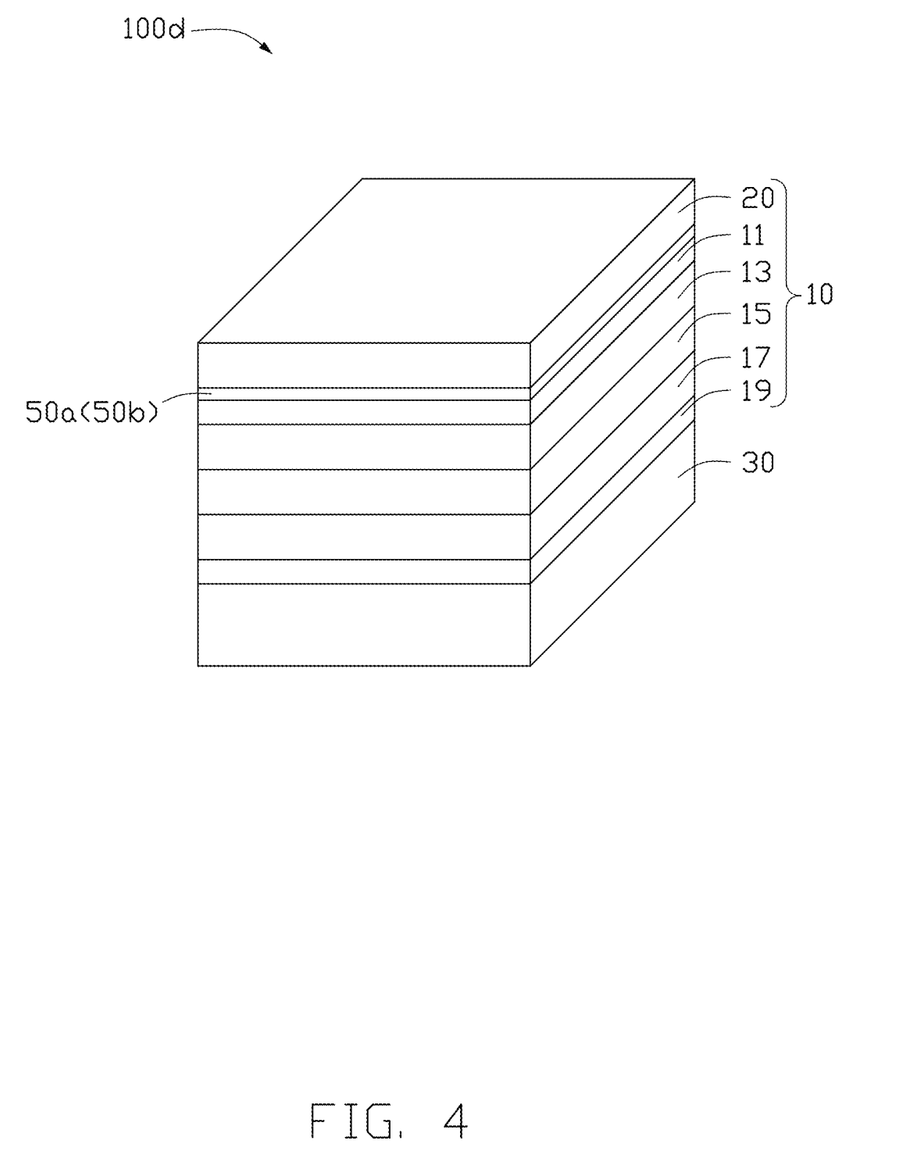
FIG. 4 is an isometric view of a display device according to a fourth embodiment of the present disclosure.

FIG. 4 illustrates a display device 100d according to a fourth embodiment of the present disclosure. The display device 100d is substantially the same as the display device 100a of the first embodiment, the display device 100d includes a transparent cover 20, an upper polarizer 11, a color filter substrate 13, a liquid crystal layer 15, a TFT substrate 17, a lower polarizer 19, and a backlight module 30 that are the same as those in the display device 100a. The main difference between the display device 100d and the display device 100a is that, in the fourth embodiment, the light adjusting component 50a or 50b is positioned between the upper polarizer 11 and the transparent cover 20. The light adjusting component 50a or 50b is formed on a surface of the transparent cover 20 adjacent to the upper polarizer 11 or a surface of the upper polarizer 11 adjacent to the transparent cover 20 by coating or depositing. Alternately, adjusting material is doped into a transparent base material to form a base layer, and the base layer is directly positioned between the upper polarizer 11 and the transparent cover 20.

Figure 5:
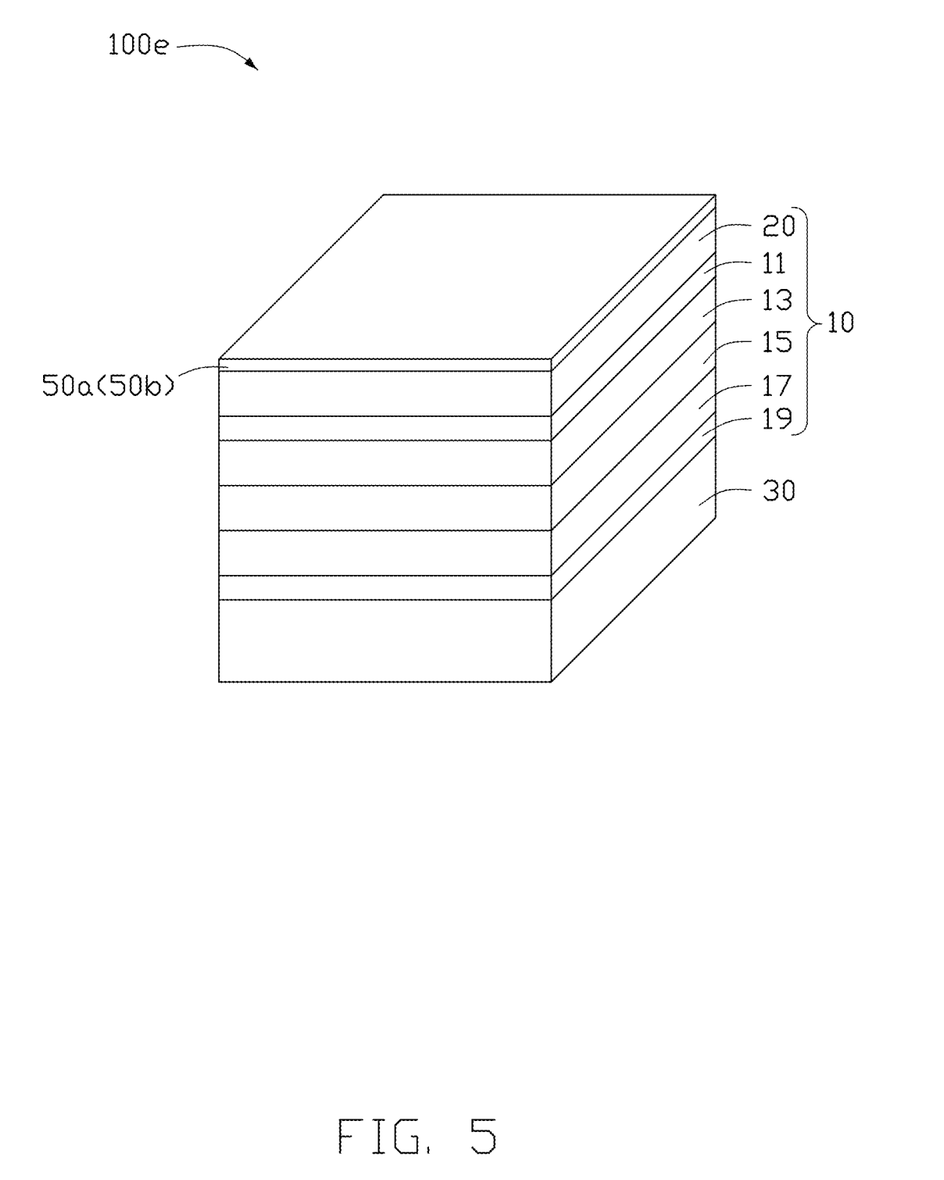
FIG. 5 is an isometric view of a display device according to a fifth embodiment of the present disclosure.

FIG. 5 illustrates a display device 100e according to a fifth embodiment of the present disclosure. The display device 100e is substantially the same as the display device 100a of the first embodiment, the display device 100e includes a transparent cover 20, an upper polarizer 11, a color filter substrate 13, a liquid crystal layer 15, a TFT substrate 17, a lower polarizer 19, and a backlight module 30 that are the same as those in the display device 100a. The main difference between the display device 100e and the display device 100a is that, in the fifth embodiment, the light adjusting component 50a or 50b is positioned on a side of the transparent cover 20 away from the upper polarizer 11. The light adjusting component 50a or 50b is formed on a surface of the transparent cover 20 away from the upper polarizer 11 by coating or depositing. Alternately, adjusting material is doped into a transparent base material to form a base layer, and the base layer is directly positioned on a side of the transparent cover 20 away from the upper polarizer 11.

FIG. 6 illustrates a display device 100f according to a sixth embodiment of the present disclosure. In this embodiment, the display device 100f includes a light adjusting component 50a or 50b in the backlight module 30. The backlight module 30 is a direct type of backlighting, and includes a reflective sheet 32, a diffusion film 34, and a brightness enhancing film 36 sequentially stacked in order. The backlight module 30 further includes a plurality of white LEDs 31, wherein the reflective sheet 32 is spaced apart from the diffusion film 34. The white LEDs 31 extend through the reflection sheet 32 and are spaced apart from the diffusion film 34. It is to be understood that conventional optical films, such as a color conversion film (not shown), may be laminated with the diffusion film 34 and the brightness enhancing film 36. The light adjusting component 50a or 50b may be positioned on any film on a side of the white LEDs 31 away from the reflective sheet 32, such as on the diffusing film 34 or on the brightness enhancing film 36. In the present embodiment, the light adjusting component 50a or 50b is positioned between the diffusion film 34 and the brightness enhancing film 36. The light adjusting component 50a or 50b is on a surface of the brightness enhancing film 36 adjacent to the diffusion film 34 or on a surface of the diffusion film 34 adjacent to the brightness enhancing film 36 by coating or depositing. Alternately, adjusting material is doped into a transparent base material to form a base layer, and the base layer is directly positioned between the diffusion film 34 and the brightness enhancing film 36.

FIG. 7 illustrates a display device 100g according to a seventh embodiment of the present disclosure. In this embodiment, the display device 100g includes a light adjusting component 50a or 50b in the backlight module 30. The backlight module 30 is a side type of backlighting, and includes a reflective sheet 32, a light guiding plate 33, a diffusion film 34, a brightness enhancing film 36 sequentially stacked in order. The backlight module 30 further includes a plurality of white LEDs 31. The white LEDs 31 are between the reflection sheet 32 and the diffusion film 34, and face a side end of the light guiding plate 33. It is to be understood that conventional optical films, such as a color conversion film (not shown), may be laminated with the diffusion film 34 and the brightness enhancing film 36. The light adjusting component 50a or 50b may be positioned on any film on a side of the light guiding plate 33 away from the reflective sheet 32, such as on the diffusing film 34 or on the brightness enhancing film 36. In the present embodiment, the light adjusting component 50a or 50b is positioned between the diffusion film 34 and the brightness enhancing film 36. The light adjusting component 50a or 50b is on a surface of the brightness enhancing film 36 adjacent to the diffusion film 34 or on a surface of the diffusion film 34 adjacent to the brightness enhancing film 36 by coating or depositing. Alternately, adjusting material is doped into a transparent base material to form a base layer, and the base layer is directly positioned between the diffusion film 34 and the brightness enhancing film 36.

The display device includes the specific white light LEDs and the light adjusting component that filters blue light of a specific wavelength and yellow light or blue light of a specific wavelength, thereby reducing eye-damaging light. The color saturation of display images is also improved.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A display device, comprising:
a display panel;
a backlight module configured for providing light for the display panel, the backlight module comprising a plurality of white light emitting diodes (LEDs) for emitting light, each of the plurality of white LEDs comprising a blue light chip and a yellow fluorescent material encapsulated on the blue light chip; and
a light adjusting component positioned in the display panel or the backlight module, wherein a transmittance of the light adjusting component for blue light having a wavelength less than 450 nm is less than 10%; a transmittance of light adjusting component for blue light having a wavelength over 470 nm is not less than 90%; the light adjusting component is configured to reduce yellow light having a wavelength of about 575 nm to 595 nm emitted from the display device;
wherein the light adjusting component comprises a blue light filter film and a yellow light filter film stacked with each other;
wherein the yellow light filter film comprises alternating arrangement of two films; and the two films have different refractive indices; each of the two films is made of a material selected from gallium nitride, titanium oxide, aluminum oxide, and indium-tin oxide.

2. The display device of claim 1, wherein the blue light filter film comprises alternating arrangement of two films; and the two films have different refractive indices; each of the two films is made of a material selected from gallium nitride, titanium oxide, aluminum oxide, and indium-tin oxide, silicon oxide, and silicon nitride.

3. The display device of claim 1, wherein a transmittance curve of the light adjusting component for yellow light exhibits a concave peak, a center of the concave peak is between 575 nm and 595 nm, and a width of the concave peak is in a range from 15 nm to 30 nm, wherein a transmittance for the yellow light in a center of the concave peak reaches a minimum of 25%.

4. The display device of claim 1, wherein the display panel comprises a transparent cover, an upper polarizer, a color filter substrate, a liquid crystal layer, a thin film transistor (TFT) substrate, and a lower polarizer, which are sequentially stacked in that order, wherein the lower polarizer is adjacent to the backlight module.

5. The display device of claim 4, wherein the light adjusting component is between the lower polarizer and the backlight module.

6. The display device of claim 4, wherein the light adjusting component is between the lower polarizer and the TFT substrate.

7. The display device of claim 4, wherein the light adjusting component is between the upper polarizer and the color filter substrate.

8. The display device of claim 4, wherein the light adjusting component is between the upper polarizer and the transparent cover.

9. The display device of claim 4, wherein the light adjusting component is on a side of the transparent cover away from the upper polarizer.

10. A display device, comprising:
a display panel;
a backlight module configured for providing light for the display panel, the backlight module comprising a plurality of white light emitting diodes (LEDs) for emitting light, each of the plurality of white LEDs comprising a blue light chip and red and green yellow fluorescent materials encapsulated on the blue light chip; and
a light adjusting component positioned in the display panel or the backlight module, wherein a transmittance of the light adjusting component for blue light having a wavelength less than 450 nm is less than 10%; a transmittance of light adjusting component for blue light having a wavelength over 470 nm is not less than 90%;
wherein the light adjusting component comprises alternating arrangement of two films; and the two films have different refractive indices; each of the two films is made of a material selected from gallium nitride, titanium oxide, aluminum oxide, and indium-tin oxide.

11. The display device of claim 10, wherein the display panel comprises a transparent cover, an upper polarizer, a color filter substrate, a liquid crystal layer, a thin film transistor (TFT) substrate, and a lower polarizer, which are sequentially stacked in that order, wherein the lower polarizer is adjacent to the backlight module.

12. The display device of claim 11, wherein the light adjusting component is between the lower polarizer and the backlight module.

13. The display device of claim 11, wherein the light adjusting component is between the lower polarizer and the TFT substrate.

14. The display device of claim 11, wherein the light adjusting component is between the upper polarizer and the color filter substrate.

15. The display device of claim 11, wherein the light adjusting component is between the upper polarizer and the transparent cover.

16. The display device of claim 11, wherein the light adjusting component is on a side of the transparent cover away from the upper polarizer.

* * * * *